United States Patent
Abdul-Ridha et al.

(10) Patent No.: US 7,719,041 B2
(45) Date of Patent: May 18, 2010

(54) MIM CAPACITOR HIGH-K DIELECTRIC FOR INCREASED CAPACITANCE DENSITY

(75) Inventors: Hadi Abdul-Ridha, Irvine, CA (US); David Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 200 days.

(21) Appl. No.: 11/729,350

(22) Filed: Mar. 28, 2007

(65) Prior Publication Data
US 2009/0065895 A1 Mar. 12, 2009

Related U.S. Application Data

(62) Division of application No. 11/121,360, filed on May 3, 2005, now Pat. No. 7,220,639.

(51) Int. Cl.
*H01L 27/108* (2006.01)
(52) U.S. Cl. .......... 257/296; 257/310
(58) Field of Classification Search ......... 257/295–296, 257/206, 310–315; 438/239–240, 381–393
See application file for complete search history.

(56) References Cited

U.S. PATENT DOCUMENTS

2004/0104420 A1* 6/2004 Coolbaugh et al. .......... 257/310

* cited by examiner

*Primary Examiner*—Dung A. Le
(74) *Attorney, Agent, or Firm*—Farjami & Farjami LLP

(57) ABSTRACT

According to one embodiment of the invention, a method for fabricating a MIM capacitor in a semiconductor die includes a step of depositing a first interconnect metal layer. The method further includes depositing a high-k dielectric layer comprising $AlN_X$ (aluminum nitride) on the first interconnect layer. The method further includes depositing a layer of MIM capacitor metal on the high-k dielectric layer. The method further includes etching the layer of MIM capacitor metal to form an upper electrode of the MIM capacitor. According to this exemplary embodiment, the first interconnect metal layer, the high-k dielectric layer, and the layer of MIM capacitor metal can be deposited in a PVD process chamber. The method further includes etching the high-k dielectric layer to form a MIM capacitor dielectric segment and etching the first interconnect metal layer to form a lower electrode of the MIM capacitor.

20 Claims, 3 Drawing Sheets

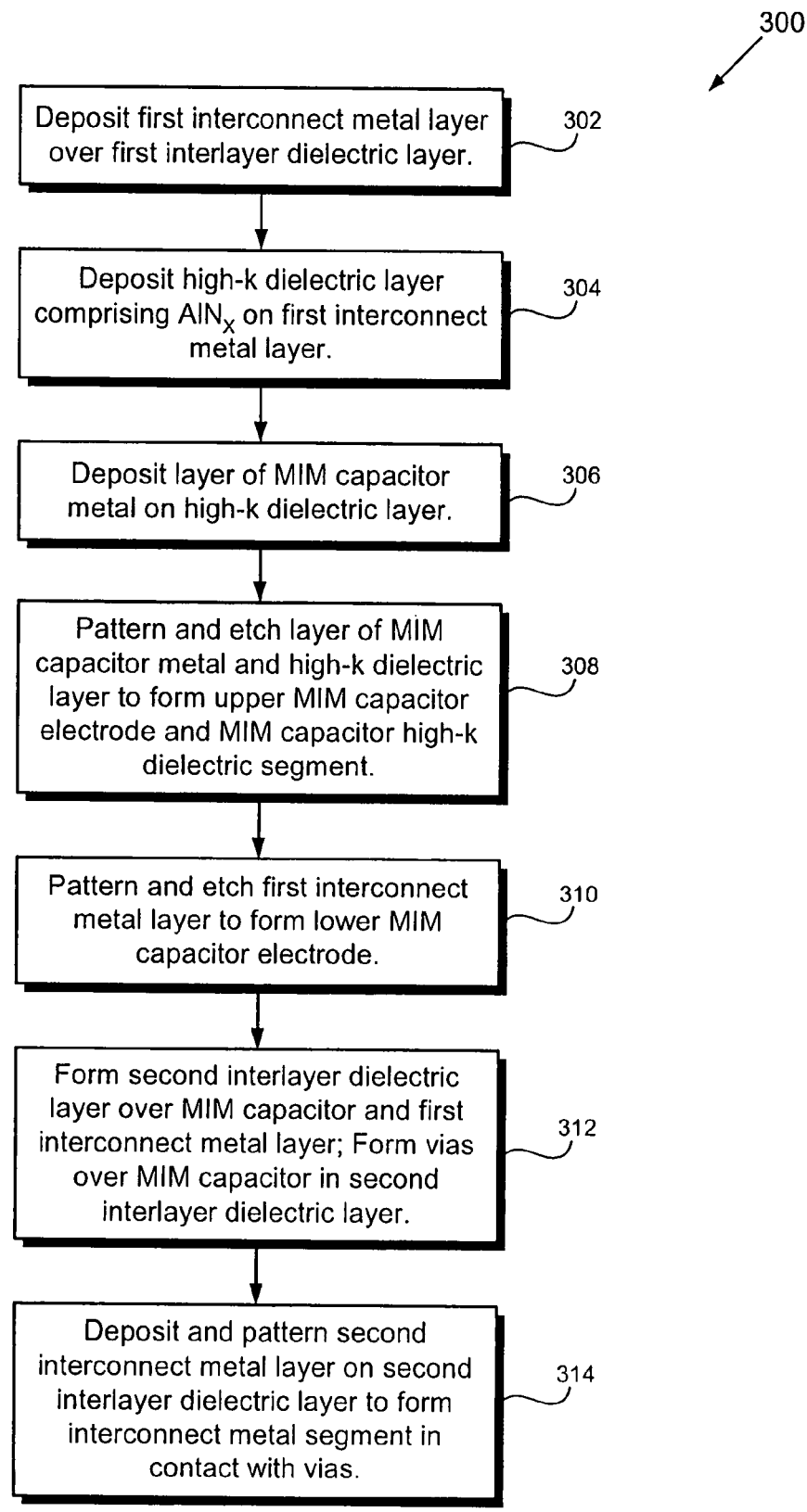

MIM CAPACITOR HIGH-K DIELECTRIC FOR INCREASED CAPACITANCE DENSITY

This is a divisional of application Ser. No. 11/121,360 filed May 3, 2005 now U.S. Pat. No. 7,220,639.

BACKGROUND OF THE INVENTION

1. Field of the Invention

The present invention is generally in the field of semiconductor fabrication. More specifically, the invention is in the field of fabrication of capacitors in semiconductor dies.

2. Background Art

High performance mixed signal and RF circuits require high-density integrated capacitors. Metal-insulator-metal ("MIM") capacitors can be considered for use in the fabrication of integrated mixed signal and RF circuits on semiconductor dies. However, typical MIM capacitors have low capacitance density and since RF and mixed signal applications require high capacitance values, the die area consumed by typical MIM capacitors is too large, resulting in increased die cost to the manufacturer.

In a conventional MIM capacitor, a MIM capacitor dielectric is situated between bottom and top metal plates, which form the electrodes of the MIM capacitor. Currently, silicon nitride (SiN) is widely utilized as a MIM capacitor dielectric in the conventional MIM capacitor. In order to increase the capacitance density in a conventional MIM capacitor, the thickness of the MIM capacitor dielectric can be reduced. However, in a conventional MIM capacitor utilizing silicon nitride as the MIM capacitor dielectric, undesirable leakage current can occur if the silicon nitride becomes too thin.

Alternatively, a high dielectric constant (high-k) dielectric having a higher dielectric constant than silicon nitride can be utilized to increase the capacitance density of the MIM capacitor. However, some high-k dielectrics, such as silicon carbide, are difficult to etch and process, while others, such as tantalum oxide, are not ready available.

Thus, there is a need in the art for a cost effective, high-k MIM capacitor dielectric that is easy to manufacture and readily available.

SUMMARY OF THE INVENTION

The present invention is directed to a method for fabricating a MIM capacitor high-k dielectric for increased capacitance density and related structure. The present invention addresses and resolves the need in the art for a cost effective, high-k MIM capacitor dielectric that is easy to manufacture and readily available.

According to one embodiment of the invention, a method for fabricating a MIM capacitor in a semiconductor die includes a step of depositing a first interconnect metal layer. The method further includes depositing a high-k dielectric layer comprising $AlN_X$ (aluminum nitride) on the first interconnect layer. The high-k dielectric layer can be deposited using a physical vapor deposition (PVD) process. The high-k dielectric layer can have a thickness of between approximately 200.0 Angstroms and approximately 350.0 Angstroms, for example. The $AlN_X$ in the high-k dielectric layer may be AlN or $AlN_2$, for example.

The method further includes depositing a layer of MIM capacitor metal on the high-k dielectric layer. The method further includes etching the layer of MIM capacitor metal to form an upper electrode of the MIM capacitor.

According to this exemplary embodiment, the first interconnect metal layer, the high-k dielectric layer, and the layer of MIM capacitor metal can be deposited in a PVD process chamber. The method further includes etching the high-k dielectric layer to form a MIM capacitor dielectric-segment and etching the first interconnect metal layer to form a lower electrode of the MIM capacitor. The method can further include depositing an interlayer dielectric layer over the upper electrode of the MIM capacitor and depositing a second interconnect metal layer on the interlayer dielectric layer. In one embodiment, the invention is a MIM capacitor fabricated by utilizing the above-discussed method. Other features and advantages of the present invention will become more readily apparent to those of ordinary skill in the art after reviewing the following detailed description and accompanying drawings.

BRIEF DESCRIPTION OF THE DRAWINGS

FIG. 3 shows a flowchart illustrating the steps taken to implement an embodiment of the present invention.

DETAILED DESCRIPTION OF THE INVENTION

The present invention is directed to a method for fabricating a MIM capacitor high-k dielectric for increased capacitance density and related structure. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
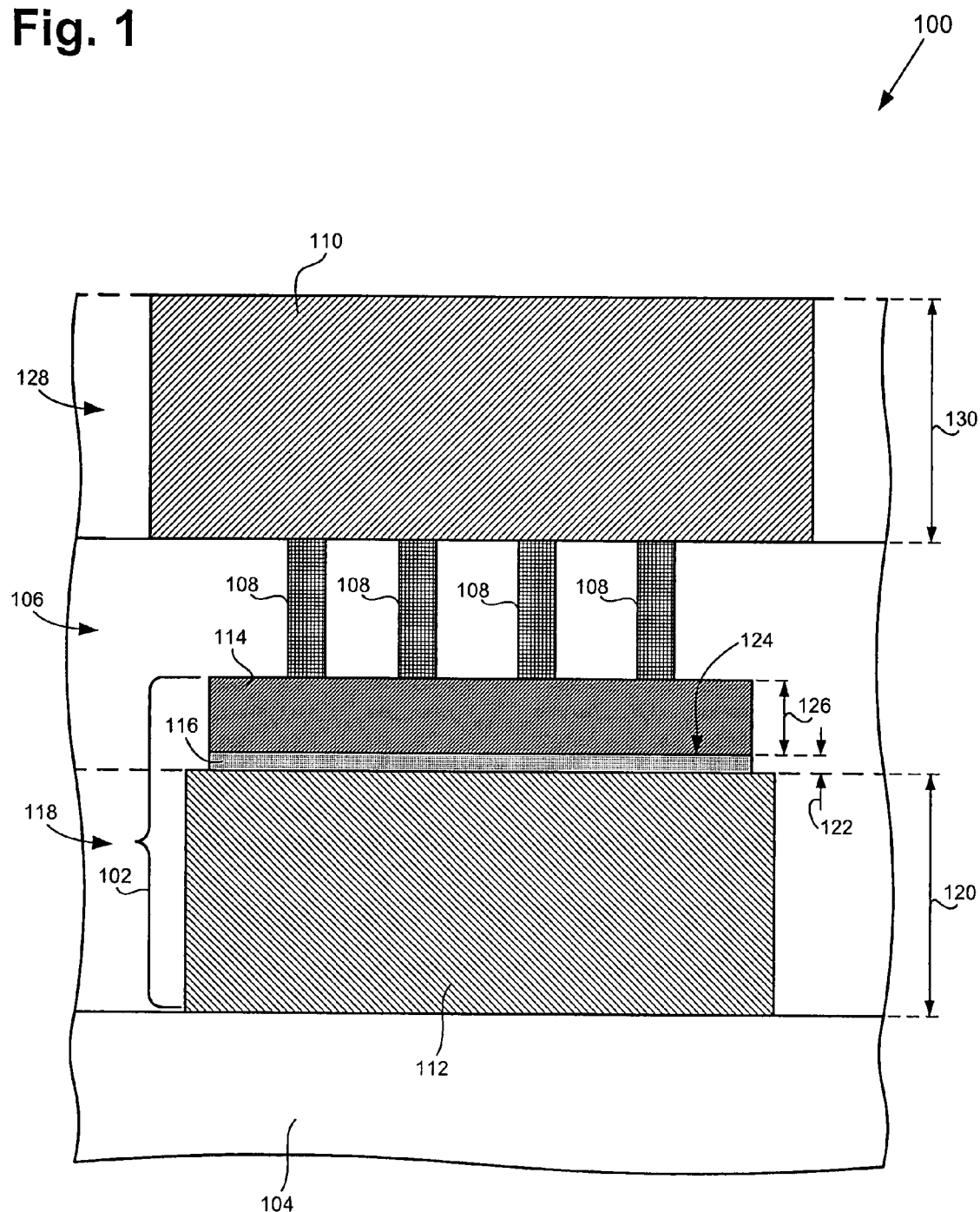
FIG. 1 illustrates a cross-sectional view of an exemplary structure including an exemplary MIM capacitor in accordance with one embodiment of the present invention.

FIG. 1 shows a cross-sectional view of a portion of a semiconductor die comprising an exemplary MIM capacitor in accordance with one embodiment of the present invention. Certain details and features have been left out of FIG. 1, which are apparent to a person of ordinary skill in the art. As shown in FIG. 1, structure 100 includes MIM capacitor 102, interlayer dielectric layers 104 and 106, vias 108, and interconnect metal segment 110. MIM capacitor 102 further includes metal plates 112 and 114 and MIM capacitor high-k dielectric segment 116.

Also shown in FIG. 1, metal plate 112 is situated on interlayer dielectric layer 104 in interconnect metal layer 118 and can comprise aluminum or other suitable metal. Metal plate 112 has thickness 120, which can be, for example, approximately 6000.0 Angstroms. Metal plate 112 can be formed by depositing a layer of interconnect metal on interlayer dielectric layer 104 by using a physical vapor deposition (PVD) process or other appropriate process. The layer of interconnect metal can be appropriately patterned and etched to form metal plate 112. In the present embodiment, interconnect metal layer 118 can be a second interconnect metal layer in a semiconductor die. In other embodiments, interconnect metal layer 118 may be a first, third, fourth, or higher interconnect metal layer in a semiconductor die. Metal plate 112 forms a "lower" electrode of MIM capacitor 102. It is noted that for the purpose of the present application, the "lower" electrode is defined as the electrode closer to interlayer dielectric layer 104 (i.e. closer to the substrate surface, which is not shown).

Further shown in FIG. 1, MIM capacitor high-k dielectric segment 116 is situated on metal plate 112 and can comprise AlN$_X$ (aluminum nitride). In the present embodiment, AlN$_X$ can be AlN or AlN$_2$. Thus, in the present embodiment, the ratio of aluminum to nitrogen in AlN$_X$ can be 1:1 (i.e. AlN) or 1:2 (i.e. AlN$_2$). In other embodiments, the ratio of aluminum to nitrogen in AlN$_X$ can be any other chemically feasible or achievable ratio, and in particular it might be any ratio between 1:1 and 1:2. MIM capacitor high-k dielectric segment 116 has thickness 122, which can be between approximately 200.0 Angstroms and approximately 350.0 Angstroms, or any other desirable thickness. MIM capacitor high-k dielectric segment 116 can be formed by depositing, patterning, and etching a high-k dielectric layer comprising AlN$_X$ on interconnect metal layer 118. The high-k dielectric layer can be deposited on interconnect metal layer 118 by using a PVD process, which advantageously allows the high-k dielectric layer to be deposited as thin as approximately 200.0 Angstroms. Alternatively, other deposition and/or growth processes or techniques can be used.

By using a PVD process, the present invention can provide a high-k dielectric layer having a highly controlled thickness such that it (i.e. the high-k dielectric layer) has a high degree of uniformity. Additionally, by using a PVD process, significantly fewer particles are introduced into the high-k dielectric film compared to a chemical vapor deposition (CVD) process, which is typically utilized to deposit a conventional MIM capacitor dielectric comprising silicon nitride. As a result, MIM capacitor high-k dielectric segment 116 has fewer defects than a conventional MIM capacitor dielectric comprising silicon nitride. The high-k dielectric layer comprising AlN$_X$ can be etched to form MIM capacitor high-k dielectric segment 116 by using a dry etch process comprising a fluorine-based etchant, such as CHF$_3$. MIM capacitor high-k dielectric segment 116 can have a dielectric constant of at least 10.0.

AlN$_X$ (aluminum nitride) has a higher density, thermal conductivity, breakdown voltage, and dielectric constant compared to silicon nitride. By way of example, AlN$_X$ may have a density of 3.25 grams per cubic centimeter (g/cc), a thermal conductivity of between 100 and 130 microns per meter per Kelvin (um/m-K), a breakdown voltage greater than 2.0 millivolts per centimeter (mv/cm) at 300.0° C., and a dielectric constant of 10.0 or higher. By way of example, silicon nitride may have a density of 2.18 g/cc, a thermal conductivity of 3.2 um/m-K, a breakdown voltage less than 2.0 mV/cm at 300.0° C. and a dielectric constant of 7.5. Since AlN$_X$ has a substantially higher thermal conductivity than silicon nitride, MIM capacitor 102, which comprises a MIM capacitor high-k dielectric segment comprising AlN$_X$, provides a lower failure rate at high temperature compared to a conventional MIM capacitor using a conventional silicon nitride MIM capacitor dielectric. Thus, by using AlN$_X$ as a MIM capacitor high-k dielectric segment, the present invention advantageously achieves increased reliability compared to a conventional MIM capacitor using a silicon nitride dielectric. Additionally, since AlN$_X$ has a higher dielectric constant than silicon nitride, the present invention advantageously achieves a MIM capacitor having a higher capacitance density than a conventional MIM capacitor using a silicon nitride dielectric. Also, AlN$_X$ has a sufficiently high density so as to prevent undesirable leakage current from occurring in the present invention's MIM capacitor high-k dielectric segment.

Also shown in FIG. 1, metal plate 114 is situated on MIM capacitor high-k dielectric segment 116 and can comprise aluminum, a layer of aluminum situated on a layer of titanium nitride, a layer of aluminum situated between layers of titanium nitride, or other suitable metal or metallic material layers or stacked layers. Metal plate 114 has thickness 126, which can be, for example, approximately 1500.0 Angstroms. Metal plate 114 can be formed by depositing a layer or a stacked layer of MIM capacitor metal on a high-k dielectric layer, which comprises AlN$_X$, using a PVD process or other appropriate process.

By using a PVD process to deposit a layer of interconnect metal, which is used to form metal plate 112, a high-k dielectric layer comprising AlN$_X$, which is used to form MIM capacitor high-k dielectric segment 116, and a layer or stacked layer of MIM capacitor metal, which is used to form metal plate 114, MIM capacitor 102 can be advantageously formed in a single process chamber, such as a PVD process chamber, without breaking vacuum. In contrast, in a conventional MIM capacitor fabrication process utilizing a silicon nitride dielectric layer, the silicon nitride dielectric layer must be formed in a different process chamber than the one (i.e. the process chamber) used to form the conventional MIM capacitor's metal plates, which reduces throughput. Thus, by utilizing a single PVD process chamber to fabricate a MIM capacitor, the present invention advantageously achieves a MIM capacitor that can be fabricated at higher throughput than a conventional MIM capacitor.

The layer or stacked layer of MIM capacitor metal can be appropriately patterned and etched in a MIM capacitor stack etch to form metal plate 114. The patterning process can include, for example, depositing and patterning a first layer of photoresist on the layer or stacked layer of MIM capacitor metal. During the MIM capacitor stack etch, the layer or stacked layer of MIM capacitor metal is etched to form metal plate 114 and the high-k dielectric layer comprising AlN$_X$ is etched to form MIM capacitor high-k dielectric segment 116. Metal plate 114 forms an "upper" electrode of MIM capacitor 102. It is noted that, for the purpose of the present application, the "upper" electrode is defined as the electrode further from interlayer dielectric 104 (i.e. further from the substrate surface which is not shown). It is also noted that, unlike metal plate 112, metal plate 114 is not formed in an interconnect metal layer. In other words, metal plate 114 is formed within interlayer dielectric 106, where conventionally no metal plate exists. After metal plate 114 and MIM capacitor dielectric segment 116 have been formed, the first layer of photoresist can be removed and a second layer of photoresist can be deposited and patterned on interconnect metal layer 118 and over metal plate 114 and MIM capacitor high-k dielectric segment 116. Interconnect metal layer 118 can then be etched to form metal plate 112.

Further shown in FIG. 1, interlayer dielectric layer 106 is situated over MIM capacitor 102 and interconnect metal layer 118. Interlayer dielectric layer 106 can comprise silicon oxide or other appropriate dielectric material and can be formed by CVD process or other appropriate deposition process. In one embodiment, interlayer dielectric layer 106 may comprise a dielectric with a low dielectric constant (i.e. "a low-k dielectric"), which has a lower dielectric constant than silicon oxide. Also shown in FIG. 1, vias 108 are situated in interlayer dielectric layer 106. In particular, vias 108 are situated over, and are in contact with, metal plate 114. Vias 108 may be formed by etching interlayer dielectric layer 106 by a standard via etch process and the vias may be filled by a suitable electrically conducting material, such as tungsten.

Further shown in FIG. 1, interconnect metal segment 110 is situated in interconnect metal layer 128 over vias 108. In the present embodiment, interconnect metal layer 128 can be a third interconnect metal layer in a semiconductor die. In other embodiments, interconnect metal layer 128 may be a second, fourth, fifth, or higher interconnect metal layer in a semiconductor die. Interconnect metal segment 110 can comprise aluminum or other suitable metal and has thickness 130, which can be, for example, approximately 6000.0 Angstroms. Interconnect metal segment 110 may be formed by depositing and patterning a layer of interconnect metal on interlayer dielectric layer 106 in a manner known in the art. Interconnect metal segment 110 is electrically connected to metal plate 114, i.e. the upper electrode of MIM capacitor 102, by vias 108.

Figure 2:
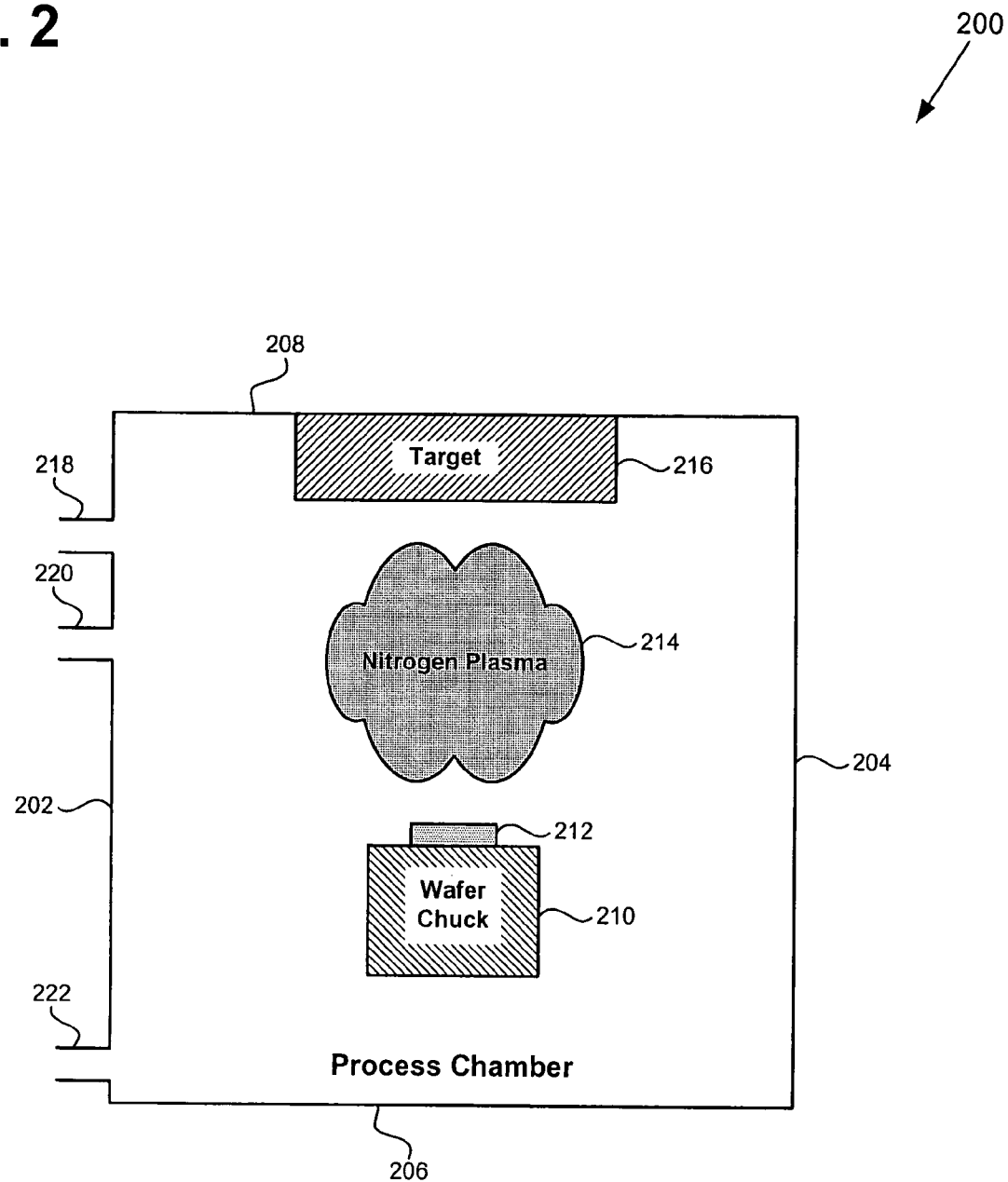
FIG. 2 illustrates a diagram of an exemplary process chamber for fabricating an exemplary MIM capacitor in accordance with one embodiment of the present invention.

FIG. 2 shows an exemplary process chamber for fabricating an exemplary MIM capacitor in accordance with one embodiment of the present invention. Certain details and features have been left out of FIG. 2 that are apparent to a person of ordinary skill in the art. Process chamber 200 includes sidewalls 202 and 204, bottom 206, top 208, wafer chuck 210, wafer 212, nitrogen plasma 214, target 216, argon gas (or other inert gas) line 218, nitrogen gas line 220, and vacuum pump line 222. Process chamber 200 can be a PVD process chamber, which can be used to fabricate MIM capacitor 102 in FIG. 1, which includes metal plates 112 and 114 and MIM capacitor high-k dielectric segment 116.

As shown in FIG. 2, target 216 is situated in process chamber 200 and can comprise aluminum. Target 216 provides a source of aluminum atoms that are combined with nitrogen to form a high-k dielectric layer comprising $AlN_X$ for a MIM capacitor on wafer 212 and can have a negative electrical charge (−V). Also shown in FIG. 2, wafer chuck 210 is situated in process chamber 200 and can be an electrostatic chuck. Wafer chuck 210 provides platform for wafer 212 and can have a positive electrical charge (+V). Further shown in FIG. 2, wafer 212 is situated on wafer chuck 210 and comprises a semiconductor die on which a MIM capacitor, such as MIM capacitor 102 in FIG. 1, is fabricated. Also shown in FIG. 2, argon gas (or other inert gas) line 218 is situated in sidewall 202 of process chamber 200 and provides a source for argon gas (or other inert gas), which can be utilized to initiate a sputtering process to dislodge aluminum atoms from target 216 during formation of a high-k dielectric layer comprising $AlN_X$.

Also shown in FIG. 2, nitrogen gas line 220 is situated in sidewall 202 of process chamber 200 and provides a source of nitrogen for nitrogen plasma 214, which can be utilized to form a high-k dielectric layer comprising $AlN_X$ on wafer 212 during formation of MIM capacitor high-k dielectric segment 116 of MIM capacitor 102, for example. Further shown in FIG. 2, vacuum pump line 222 is situated in sidewall 202 of process chamber 200 and is coupled to a vacuum pump (not shown in FIG. 2), which can be utilized to provide a high vacuum in process chamber 200. By way of example, the vacuum pump (not shown in FIG. 2) can provide a vacuum greater than $1.0 \times 10^{-9}$ torr in process chamber 200 for a PVD process. In contrast, a conventional CVD process chamber provides a vacuum that is less than $1.0 \times 10^{-5}$ torr or less than $1.0 \times 10^{-3}$ torr for a CVD process. The greater vacuum provided in the PVD process causes less unwanted particles to be introduced into the high-k dielectric layer than in a layer of silicon nitride that is deposited in a CVD process. Thus, by using a PVD process to form a high-k dielectric layer that is used to form a MIM capacitor high-k dielectric segment, the present invention advantageously provides a MIM capacitor high-k dielectric segment that has fewer defects than a conventional MIM capacitor dielectric comprising silicon nitride.

The formation of a high-k dielectric layer comprising $AlN_X$, which is used to form the invention's MIM capacitor high-k dielectric segment, in process chamber 200 will now be discussed. Initially, argon gas (or other inert gas) is introduced into process chamber 200 through argon gas (or other inert gas) line 218. The argon gas (or other inert gas) is then ionized by, for example, a radio frequency (RF) power source (not shown in FIG. 2) to form an argon (or other inert gas) ion plasma. The argon (or other inert gas) ion plasma starts a sputtering process, whereby target 216 is bombarded with argon (or other inert gas) ions such that aluminum atoms are dislodged from target 216. Nitrogen gas is introduced into process chamber 200 through nitrogen gas line 220 and ignited by the RF power source (not shown in FIG. 2) to form nitrogen plasma 214.

As a result of the electric field formed between negatively charged target 216 and positively charge wafer chuck 210, aluminum atoms that are dislodged from target 216 by the argon (or other inert gas) ions are attracted to wafer 212, which is situated on wafer chuck 210. While the aluminum atoms are being attracted to wafer 212, nitrogen in nitrogen plasma 214 combines with the aluminum atoms to form $AlN_X$, which is deposited on wafer 212. The dielectric constant of the high-k dielectric layer comprising $AlN_X$ that is deposited on wafer 212 is determined by the nitrogen concentration in the $AlN_X$. For example, by appropriately increasing the nitrogen concentration in the $AlN_X$, the dielectric constant of the high-k dielectric layer can be increased to a value greater than 10.0. Thus, since a MIM capacitor high-k dielectric segment (e.g. MIM capacitor high-k dielectric segment 116) is formed from the high-k dielectric layer comprising $AlN_X$, the present invention achieves a MIM capacitor (e.g. MIM capacitor 102) having a high capacitance density.

Also, metal plates 112 and 114 of MIM capacitor 102 can also be formed in the PVD process chamber (e.g. process chamber 200) in addition to MIM capacitor high-k dielectric segment 116 without breaking vacuum, which advantageously increases wafer throughput. Further, only nitrogen gas 220 has to be added to process chamber 200 to form MIM capacitor high-k dielectric segment 116. Thus, MIM capacitor high-k dielectric segment 116 can be formed without incurring the increased manufacturing cost associated with providing an additional process tool, such as an additional etch tool, or adding an additional target to process chamber 200. Moreover, since the vacuum formed in process chamber 200 is greater than the vacuum formed in a CVD process chamber, process chamber maintenance is significantly lower for a MIM capacitor including a MIM capacitor high-k dielectric segment that comprises $AlN_X$ compared to a conventional MIM capacitor comprising a silicon nitride MIM capacitor dielectric.

FIG. 3 shows flowchart 300, which describes the steps, according to one embodiment of the present invention, of a process by which MIM capacitor 102 in structure 100 in FIG. 1 is fabricated. Certain details and features have been left out of flowchart 300 that are apparent to a person of ordinary skill in the art. For example, a step may consist of one or more substeps or may involve specialized equipment or materials, as known in the art. Steps 302 through 314 indicated in flowchart 300 are sufficient to describe one embodiment of the present invention; other embodiments of the invention may utilize steps different from those shown in flowchart 300. It is noted that the processing steps shown in flowchart 300 are performed on a wafer, which, prior to step 302, includes a first interlayer dielectric layer, e.g. interlayer dielectric 104 shown in FIG. 1.

At step 302 of flowchart 300, a first interconnect metal layer is deposited over a first interlayer dielectric layer (e.g. interlayer dielectric layer 104). The first interconnect metal layer (e.g. interconnect metal layer 118) can be interconnect metal layer two of a semiconductor die, for example. At step 304 of flowchart 300, a high-k dielectric layer comprising $AlN_X$ (aluminum nitride) is deposited on the first interconnect metal layer (e.g. interconnect metal layer 118). The high-k dielectric layer can be deposited on the first interconnect metal layer using a PVD process. In the present embodiment, the high-k dielectric layer can comprise AlN or $AlN_2$ and can have a dielectric constant of at least 10.0. In other embodiments, the high-k dielectric layer can comprise $AlN_X$ that has a ratio of aluminum to nitrogen of less than 1:2. The high-k dielectric layer can have a thickness (e.g. thickness 122) of between approximately 200.0 Angstroms and approximately 350.0 Angstroms, for example.

At step 306 of flowchart 300, a layer of MIM capacitor metal comprising, for example, aluminum is deposited on the high-k dielectric layer. The MIM capacitor metal may have a thickness of approximately 1500.0 Angstroms and may be deposited using a PVD process, for example. At step 308 of flowchart 300, the layer of MIM capacitor metal and the high-k dielectric layer are patterned and etched to form an upper MIM capacitor electrode (e.g. metal plate 114) and a MIM capacitor dielectric segment (e.g. dielectric segment 116). The layer of MIM capacitor metal and the high-k dielectric layer can be patterned and etched in a manner known in the art.

At step 310 of flowchart 300, the first interconnect metal layer (e.g. interconnect metal layer 118) can be patterned and etched to form a lower MIM capacitor electrode (e.g. metal plate 112). For example, the first interconnect metal layer may be patterned by depositing and patterning a layer of photoresist over metal plate 114 and dielectric segment 116 and the first interconnect metal layer may be etched using an appropriate etch process. As a result, MIM capacitor 102, which comprises MIM capacitor high-k dielectric segment 116 situated between metal plate 112 (i.e. a lower electrode of MIM capacitor 102) and metal plate 114 (i.e. an upper electrode of MIM capacitor 102) is formed.

At step 312 of flowchart 300, a second interlayer dielectric layer (e.g. interlayer dielectric layer 106) is formed over MIM capacitor 102 and the first interconnect metal layer (e.g. interconnect metal layer 118). The second interlayer dielectric layer may comprise silicon oxide or other appropriate dielectric material and may be deposited using a CVD process or other appropriate deposition processes. Vias 108 are formed in the second interlayer dielectric layer (e.g. interlayer dielectric layer 106), over, and in contact with, the upper electrode of MIM capacitor 102 (i.e. metal plate 114). Vias 108 may be formed by etching the second interlayer dielectric layer by a standard via etch process and can be filled with an electrically conductive material such as tungsten, for example.

At step 314 of flowchart 300, a second interconnect metal layer (e.g. interconnect metal layer 128) is deposited and patterned on the second interlayer dielectric layer to form an interconnect metal segment (e.g. interconnect metal segment 110) in contact with vias 108. The second interconnect metal layer can comprise aluminum, for example, and may have a thickness of approximately 6000.0 Angstroms. The second interconnect metal layer can be situated in interconnect metal layer three of a semiconductor die, for example. The interconnect metal segment is electrically connected to metal plate 114 (i.e. the upper electrode of MIM capacitor 102) by vias 108.

Thus, as described above, by forming a MIM capacitor including a MIM capacitor high-k dielectric segment comprising $AlN_X$, the present invention advantageously achieves a MIM capacitor having increased capacitance density compared to a conventional MIM capacitor including a MIM capacitor dielectric comprising silicon nitrided. Also, by forming a MIM capacitor high-k dielectric segment comprising $AlN_X$, the present invention achieves a MIM capacitor high-k dielectric segment that can be advantageously fabricated using a PVD process, which provides a dielectric film having reduced defects and increased uniformity control compared to a conventional MIM capacitor dielectric, such as silicon nitride, that is fabricated using a CVD process.

Furthermore, by forming a MIM capacitor high-k dielectric comprising $AlN_X$, the present invention achieves a MIM capacitor that can be fabricated in a single PVD process chamber without breaking vacuum. As a result, the present invention advantageously achieves increased MIM capacitor throughput compared to a conventional MIM capacitor fabrication process that utilizes different process chambers to fabricate the metal plates and the dielectric for the MIM capacitor. Moreover, by utilizing $AlN_X$ to form a MIM capacitor high-k dielectric, the present invention advantageously fabricates the MIM capacitor high-k dielectric utilizing a dielectric material that is readily available and easy to manufacture.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for fabricating a MIM capacitor high-k dielectric for increased capacitance density and related structure have been described.

The invention claimed is:

1. A MIM capacitor in a semiconductor die, said MIM capacitor comprising:
    a lower electrode of said MIM capacitor, said lower electrode of said MIM capacitor being situated in a first interconnect metal layer in said semiconductor die;
    a MIM capacitor high-k dielectric segment situated on said lower electrode of said MIM capacitor;
    an upper electrode of said MIM capacitor situated on said MIM capacitor high-k dielectric segment;
    wherein said MIM capacitor high-k dielectric segment is selected from the group consisting of AlN and $AlN_2$, wherein said upper electrode of said MIM capacitor comprises at least two metal layers.

2. The MIM capacitor of claim 1 wherein said MIM capacitor high-k dielectric segment has a thickness of between approximately 200.0 Angstroms and approximately 350.0 Angstroms.

3. The MIM capacitor of claim 1 wherein an interlayer dielectric layer is situated over said upper electrode of said MIM capacitor.

4. The MIM capacitor of claim 3 wherein an interconnect metal segment is situated on said interlayer dielectric layer, said interconnect metal segment being situated in a second interconnect metal layer of said semiconductor die.

5. The MIM capacitor of claim 4 wherein said interconnect metal segment is connected to said upper electrode of said MIM capacitor by at least one via.

6. The MIM capacitor of claim 1 wherein said MIM capacitor high-k dielectric segment has a dielectric constant of at least 10.0.

7. The MIM capacitor of claim 3 wherein said interlayer dielectric layer comprises a low-k dielectric.

8. The MIM capacitor of claim 3 wherein said upper electrode of said MIM capacitor has a thickness of approximately 1500.0 Angstroms.

9. The MIM capacitor of claim 1 wherein said upper electrode of said MIM capacitor comprises a layer of aluminum situated on a layer of titanium nitride.

10. The MIM capacitor of claim 1 wherein said upper electrode of said MIM capacitor comprises a layer of aluminum situated between layers of titanium nitride.

11. A MIM capacitor in a semiconductor die, said MIM capacitor comprising:
 a lower electrode of said MIM capacitor, said lower electrode of said MIM capacitor being situated in a first interconnect metal layer in said semiconductor die;
 a MIM capacitor high-k dielectric segment situated on said lower electrode of said MIM capacitor;
 an upper electrode of said MIM capacitor situated on said MIM capacitor high-k dielectric segment;
 wherein said MIM capacitor high-k dielectric segment comprises $AlN_x$, wherein said upper electrode of said MIM capacitor comprises at least two metal layers.

12. The MIM capacitor of claim 11 wherein said $AlN_x$ is selected from the group consisting of AlN and $AlN_2$.

13. The MIM capacitor of claim 11 wherein a ratio of aluminum to nitrogen in said $AlN_x$ is between 1:1 and 1:2.

14. The MIM capacitor of claim 11 wherein said upper electrode of said MIM capacitor is formed in an interlayer dielectric layer.

15. The MIM capacitor of claim 14 wherein said interlayer dielectric layer comprises a low-k dielectric.

16. The MIM capacitor of claim 11 wherein said MIM capacitor high-k dielectric segment has a thickness of between approximately 200.0 Angstroms and approximately 350.0 Angstroms.

17. The MIM capacitor of claim 14 wherein an interconnect metal segment is situated on said interlayer dielectric layer, said interconnect metal segment being situated in a second interconnect metal layer of said semiconductor die.

18. The MIM capacitor of claim 17 wherein said interconnect metal segment is connected to said upper electrode of said MIM capacitor by at least one via.

19. The MIM capacitor of claim 11 wherein said MIM capacitor high-k dielectric segment has a dielectric constant of at least 10.0.

20. The MIM capacitor of claim 11 wherein said upper electrode of said MIM capacitor comprises a layer of aluminum and at least one layer of titanium nitride.

\* \* \* \* \*